(12) United States Patent
Jiang et al.

(10) Patent No.: US 8,052,437 B2
(45) Date of Patent: Nov. 8, 2011

(54) BACK-MOUNT GANGED ELECTRICAL OUTLETS

(75) Inventors: Yuchun Jiang, Saint Peters, MO (US); Michael Jansma, Eureka, MO (US)

(73) Assignee: American Power Conversion Corporation, West Kingston, RI (US)

( * ) Notice: Subject to any disclaimer, the term of this patent is extended or adjusted under 35 U.S.C. 154(b) by 0 days.

(21) Appl. No.: 13/100,824

(22) Filed: May 4, 2011

(65) Prior Publication Data

US 2011/0223785 A1    Sep. 15, 2011

Related U.S. Application Data

(63) Continuation of application No. 12/720,085, filed on Mar. 9, 2010.

(51) Int. Cl.
*H01R 4/66* (2006.01)
(52) U.S. Cl. .................................................. 439/106
(58) Field of Classification Search ........... 439/106, 439/107
See application file for complete search history.

(56) References Cited

U.S. PATENT DOCUMENTS

| | | | | |
|---|---|---|---|---|
| 3,170,744 A * | 2/1965 | Farnsworth | ............... | 439/106 |
| 3,171,113 A * | 2/1965 | McNamara | ............... | 340/649 |
| 3,500,284 A * | 3/1970 | Liberman | ............... | 439/106 |
| 4,477,131 A * | 10/1984 | Joly | ............... | 439/106 |
| 4,930,047 A | 5/1990 | Peterson | | |
| 5,429,518 A * | 7/1995 | Chen | ............... | 439/188 |
| 5,582,520 A * | 12/1996 | Doudon | ............... | 439/106 |
| 6,015,307 A * | 1/2000 | Chiu et al. | ............... | 439/139 |
| 6,045,399 A | 4/2000 | Yu | | |
| 6,072,705 A * | 6/2000 | Hsu | ............... | 363/39 |
| 6,220,880 B1 * | 4/2001 | Lee et al. | ............... | 439/214 |
| 6,315,593 B1 | 11/2001 | Bentley et al. | | |
| 6,443,746 B1 | 9/2002 | Yu | | |
| 6,514,093 B1 * | 2/2003 | Yu | ............... | 439/105 |
| 6,638,074 B1 * | 10/2003 | Fisher | ............... | 439/22 |
| 6,750,410 B2 * | 6/2004 | Lee | ............... | 200/51.03 |

(Continued)

FOREIGN PATENT DOCUMENTS

GB    2 105 924 A    3/1983

OTHER PUBLICATIONS

Invitation to Pay Additional Fees with Partial International Search mailed May 26, 2011.

(Continued)

*Primary Examiner* — Tulsidas C Patel
*Assistant Examiner* — Vladimir Imas
(74) *Attorney, Agent, or Firm* — Lando & Anastasi, LLP

(57) ABSTRACT

An electrical ganged-outlet apparatus includes a plurality of electrical outlets molded together as a unitary outlet body having a front surface and a back surface. Each of the electrical outlets has an aperture extending through the front surface, a peripheral wall and a sidewall opposing the peripheral wall, a shoulder adjacent to the front surface of the unitary outlet body and the sidewall of the electrical outlet, and an opening molded in the sidewall adjacent to the shoulder and in communication with the aperture. The shoulder is constructed and arranged to engage a latching member attached to the electrical inlet connector when the electrical inlet connector is inserted into the aperture. The opening in the sidewall extends from the shoulder through the back surface, and is constructed and arranged to receive the latching member to retain the electrical inlet connector within the aperture.

14 Claims, 12 Drawing Sheets

U.S. PATENT DOCUMENTS

| | | | |
|---|---|---|---|
| 6,939,180 B1* | 9/2005 | Wu | 439/650 |
| 6,940,015 B2* | 9/2005 | Fang | 174/53 |
| 7,052,313 B2* | 5/2006 | Gorman | 439/535 |
| 7,148,419 B1* | 12/2006 | Harrigan | 174/53 |
| 7,192,289 B2* | 3/2007 | Kowalski | 439/106 |
| 7,195,500 B2* | 3/2007 | Huang et al. | 439/107 |
| 7,268,998 B2 | 9/2007 | Ewing et al. | |
| 7,400,239 B2* | 7/2008 | Kiko et al. | 340/501 |
| 7,479,031 B2* | 1/2009 | Tiberio et al. | 439/538 |
| 7,488,204 B2* | 2/2009 | Hsu | 439/535 |
| 7,500,854 B2* | 3/2009 | Gottstein | 439/13 |
| 7,554,033 B1* | 6/2009 | Bhosale et al. | 174/53 |
| 7,581,977 B1* | 9/2009 | Wu | 439/346 |
| 7,675,739 B2* | 3/2010 | Ewing et al. | 361/623 |
| 7,679,007 B1* | 3/2010 | Walker et al. | 174/481 |
| 7,749,019 B2* | 7/2010 | Valentin et al. | 439/538 |
| 7,753,699 B2* | 7/2010 | Wu | 439/106 |
| 2003/0092297 A1* | 5/2003 | Reindle et al. | 439/107 |
| 2006/0057873 A1* | 3/2006 | Ortega | 439/107 |
| 2006/0199438 A1 | 9/2006 | Cleveland | |
| 2009/0213567 A1 | 8/2009 | Mandapat et al. | |

OTHER PUBLICATIONS

International Search Report for PCT/US20111027582 mailed Jul. 11, 2011.

* cited by examiner

BACK-MOUNT GANGED ELECTRICAL OUTLETS

CROSS-REFERENCE TO RELATED APPLICATIONS

This application is a continuation and claims the benefit under 35 U.S.C. §120 of U.S. patent application Ser. No. 12/720,085, entitled "BACK-MOUNT GANGED ELECTRICAL OUTLETS" and filed by Yuchun Jiang et al. on Mar. 9, 2010, which is hereby incorporated by reference in its entirety.

BACKGROUND OF THE INVENTION

1. Field of Invention

The present disclosure relates generally to electrical power outlet devices, and more particularly to back-mounted ganged electrical outlet devices for use in power distribution units.

2. Discussion of Related Art

Conventional switched rack-mounted power distribution units (PDUs) employ many individual interconnected outlets (also called receptacles) to form a gang of outlets. When constructing the PDU, individual outlets are necessary in order to accommodate the spacing required for internal electronics between each outlet, such as printed circuit boards (PCB), relays, and other components, as well as for light pipes (for indicating the on/off state of each switched outlet). This configuration requires tying the respective connection leads from multiple individual outlets together for attachment to the incoming power connections. If so equipped, safety ground terminals must also be wired together. This involves the connection and routing of multiple wires and PCBs in very tight spaces, as well as the use of many individual outlets, which increases the complexity, size, and cost of the PDU. Therefore, a smaller, low-profile design is desirable for accommodating PDUs within the limited space of crowded equipment racks.

Furthermore, conventional PDUs are difficult to assemble because many components, including the outlets, PCBs, wiring, enclosure, etc., must all be assembled together at the same time.

BRIEF SUMMARY OF THE INVENTION

According to an embodiment, an electrical ganged-outlet apparatus includes a unitary outlet body having a plurality of electrical outlets and a back surface. Each of the electrical outlets has at least a first and a second receptacle contact element, and a line terminal. The line terminal is electrically connected to the first receptacle contact element and extends from the back surface. The outlet body has at least one neutral bus bar disposed against the back surface, and the neutral bus bar is electrically connected to the second receptacle contact element.

According to another embodiment, the electrical ganged-outlet apparatus may include a substrate releasably coupled to the line terminal. The substrate may have at least one electrical connector configured to be releasably coupled to the line terminal of at least one outlet. The substrate may have at least one relay electrically coupled to the electrical connector. The substrate may have at least one light emitting diode mounted to the substrate.

According to another embodiment, the outlet body may include a front surface and at least one light pipe axial bore extending through the front surface substantially in axial relation to the light emitting diode. Each light pipe axial bore may have a counterbore concentric with the light pipe axial bore. The counterbore may open to the front surface, and may have a diameter greater than the light pipe axial bore.

According to another embodiment, the electrical ganged-outlet apparatus may have at least one light pipe disposed in the light pipe axial bore. Each light pipe has a cylindrical body and a flange radially extending therefrom such that the cylindrical body fits within the respective light pipe axial bore and the flange is seated within the respective counterbore.

According to another embodiment, the electrical outlet device may include a cover attached to the outlet body. The cover may have at least one opening configured to align with the cylindrical body of the light pipe, wherein the flange of the light pipe is secured within the counterbore by the cover.

According to another embodiment, the outlet body may be releasably mounted to the cover, and the cover may have a plurality of access apertures for accessing each of the electrical outlets.

According to another embodiment, the outlet body may have a plurality of axial bores. Each axial bore may have an internal thread adapted to receive an external thread of an externally threaded fastener for mounting the outlet body to the cover.

According to another embodiment, the neutral bus bar may include a first end and a second end, the first end and the second end each being constructed and arranged to be connected to at least one power supply.

According to another embodiment, the plurality of electrical outlets may have a third receptacle contact element. The electrical ganged-outlet apparatus may include a ground bus bar disposed against the back surface of the outlet body and electrically coupled to each of the third receptacle contact elements. In another embodiment, the ground bus bar may be adapted to be electrically coupled to the cover.

According to another embodiment, each of the electrical outlets may include an opening configured to receive a latching member of an electrical inlet connector.

According to another embodiment, an electrical ganged-outlet apparatus includes a unitary outlet body comprising a front surface, a back surface, and a plurality of electrical outlets. Each of the electrical outlets has an aperture extending through the front surface, a shoulder adjacent to the aperture, and an opening in communication with the aperture. The opening extends from the shoulder through the back surface. The aperture is constructed and arranged to receive an electrical inlet connector therein. The opening is constructed and arranged to receive a latching member attached to the electrical inlet connector to retain the electrical inlet connector within the aperture. The shoulder is constructed and arranged to engage the latching member when the electrical inlet connector is inserted into the aperture.

According to another embodiment, the outlet body may include at least one line terminal extending therefrom. The line terminal may be electrically connected to at least one of the electrical outlets.

According to another embodiment, the electrical ganged-outlet apparatus may have a substrate releasably coupled to the line terminal.

According to another embodiment, the electrical ganged-outlet apparatus may include a cover releasably coupled to the outlet body.

According to another embodiment, the electrical ganged-outlet apparatus may include at least one status indicator mounted to the outlet body. The status indicator may include a light pipe. The status indicator may include a light emitting diode.

According to another embodiment, the electrical ganged-outlet apparatus may include at least one bus bar disposed against the back surface. The bus bar may be electrically connected to at least one of the electrical outlets.

According to another embodiment, a method of assembling a ganged-outlet apparatus includes attaching an outlet body to a substrate to form a subassembly. The substrate has at least one electrical connector mounted thereon. The outlet body includes a plurality of electrical outlets and at least one line terminal extending from the outlet body. The line terminal is constructed and arranged to attach to the electrical connector. The method also includes mounting a cover to the subassembly by or with at least one fastener.

According to another embodiment, the outlet body may have at least one light pipe axial bore through the outlet body and at least one light pipe inserted into the at least one light pipe axial bore. The method may include securing the light pipe between the outlet body and the cover.

According to another embodiment, the outlet body and the substrate each include at least one neutral electrical connector. The method may include connecting the neutral electrical connector of the outlet body to the neutral electrical connector of the substrate with a wire.

According to yet another embodiment, an electrical ganged-outlet apparatus includes a plurality of electrical outlets molded together as a unitary outlet body having a front surface and a back surface. Each of the electrical outlets has an aperture extending through the front surface, a peripheral wall and a sidewall opposing the peripheral wall, a shoulder adjacent to the front surface of the unitary outlet body and the sidewall of the electrical outlet, and an opening molded in the sidewall adjacent to the shoulder and in communication with the aperture. The shoulder is constructed and arranged to engage a latching member attached to the electrical inlet connector when the electrical inlet connector is inserted into the aperture. The opening in the sidewall extends from the shoulder through the back surface, and is constructed and arranged to receive the latching member to retain the electrical inlet connector within the aperture.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE INVENTION

Figure 1:
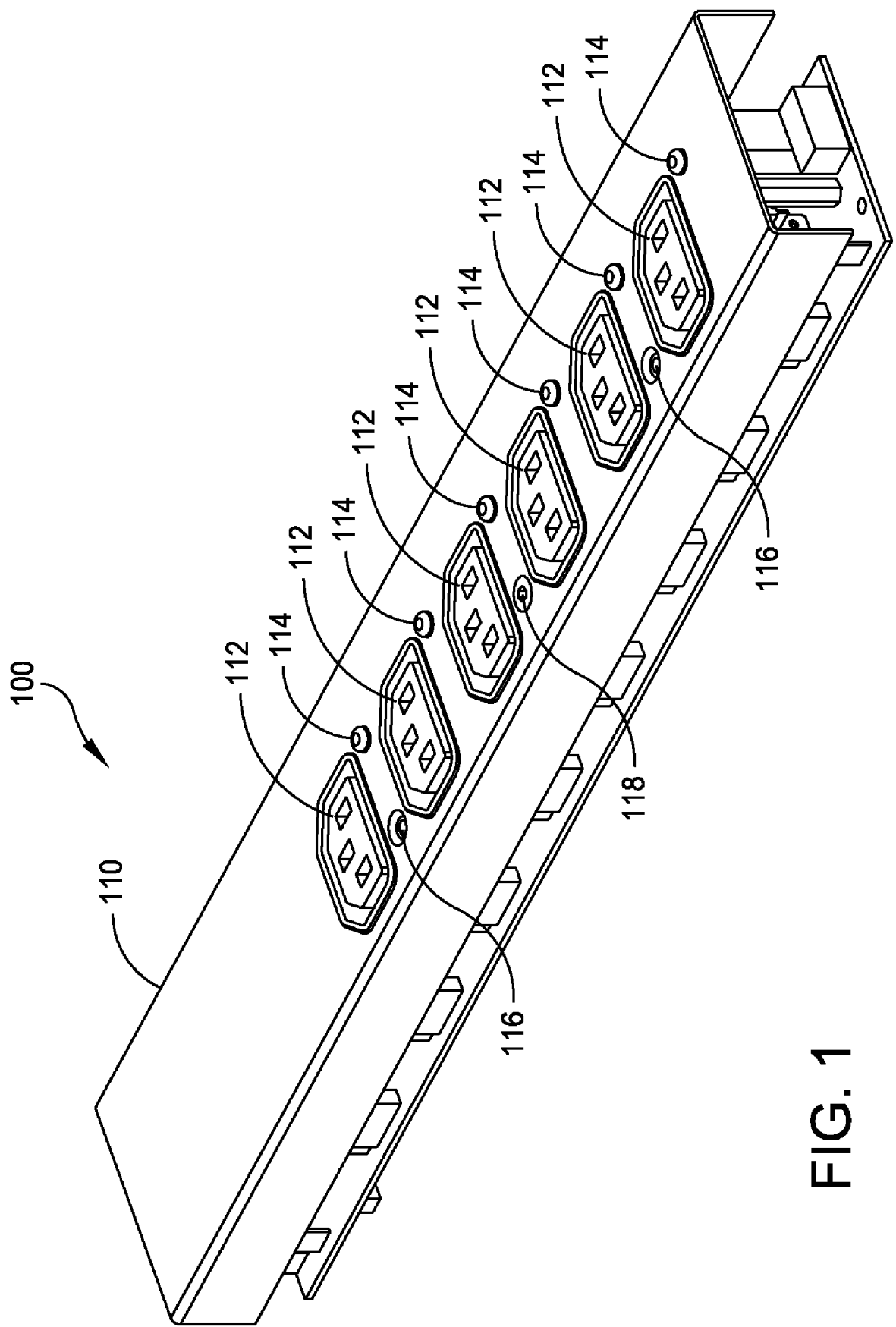
FIG. 1 is a top perspective view of an exemplary power distribution unit (PDU) in accordance with one embodiment of the present disclosure.

Embodiments of the invention are not limited in its application to the details of construction and the arrangement of components set forth in the following description or illustrated in the drawings. Embodiments of the invention are capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The present disclosure relates to a power distribution unit (PDU) for providing power to one or more electronic devices. An aspect of the PDU includes multiple, or ganged outlets. The PDU may be mounted within an equipment cabinet or equipment rack, such as those commonly used in data centers and electronic equipment rooms. Rack-mounted PDUs compete with a myriad of other electronic devices for limited space within the equipment rack. Reducing the size and number of parts and wiring connections that comprise the PDU results in valuable rack space being reclaimed for other uses. A design embodied by these principles simplifies manufacture and assembly of the PDU.

According to another aspect, the PDU includes a unitary outlet body having a plurality of electrical outlets. The electrical outlets each include two or more electrical connectors. In one embodiment, the outlet body includes at least one line terminal connected to one or more of the electrical connectors. The line terminal may be any electrical terminal or connector. In another embodiment, the outlet body includes at least one bus bar connected to one or more of the electrical connectors. The outlet body may be formed as a single unit that can be connected to a substrate, such as a printed circuit board, by either the line terminal or the bus bar, or both. The combination of the outlet body and substrate forms an integrated subassembly that may be subsequently mounted to a cover or housing.

According to yet another aspect, conventional switched PDUs have lighted indicators to show a user whether a particular outlet is energized. In one embodiment, the light source is an LED mounted on a substrate. The light emitted by the LED is transmitted up through the exterior cover or housing of the PDU by a light pipe, which may be made of a translucent material. Light pipes are conventionally press-fitted into openings on the PDU cover and have a tendency to come loose and fall out due to vibration during shipping or for other reasons. Therefore, it is desirable to employ an alternative PDU and light pipe design that ensures the light pipes will not inadvertently become dislodged from the PDU. In one embodiment, each light pipe is configured with a flange that is captured between the outlet body and the cover, which holds the light pipe in place when the outlet body is mounted to the cover.

According to yet another aspect, the connection of electronic equipment to the outlets of a PDU is usually accomplished using detachable connectors. Many PDUs utilize locking connectors to improve the integrity of connections between receptacles and plugs. An example is an IEC C14- or C19-style connector with a resilient locking or retaining member to prevent the inadvertent removal of the plug from the receptacle. To enable the locking feature of such connectors, the receptacle must include a corresponding recess or opening for receiving and engaging the locking member of the connector, for example as found in an IEC C13-style receptacle. One method of manufacturing such outlets is to mold each receptacle individually using a sliding core to form this opening. When parts are molded with hollow interior spaces or openings, the portion of the mold used to form the hollow space or opening will interfere with the ejection of the part from the mold. An alternative mold design uses a sliding core. Sliding cores are movable parts of the mold that can be retracted after molding, allowing the part to be ejected from the mold without interference. However, it is not possible to mold multiple (or ganged) locking outlets as a single unit using a sliding core. This is because the geometry of the ganged outlets prevents a sliding core from reaching all outlets other than the outlet(s) having the opening located on the outer surface of the part. Therefore, it is desirable to employ an alternative design, which can be accommodated by most practical molding processes, for molding gang outlets having an opening for the locking feature.

Figure 2:
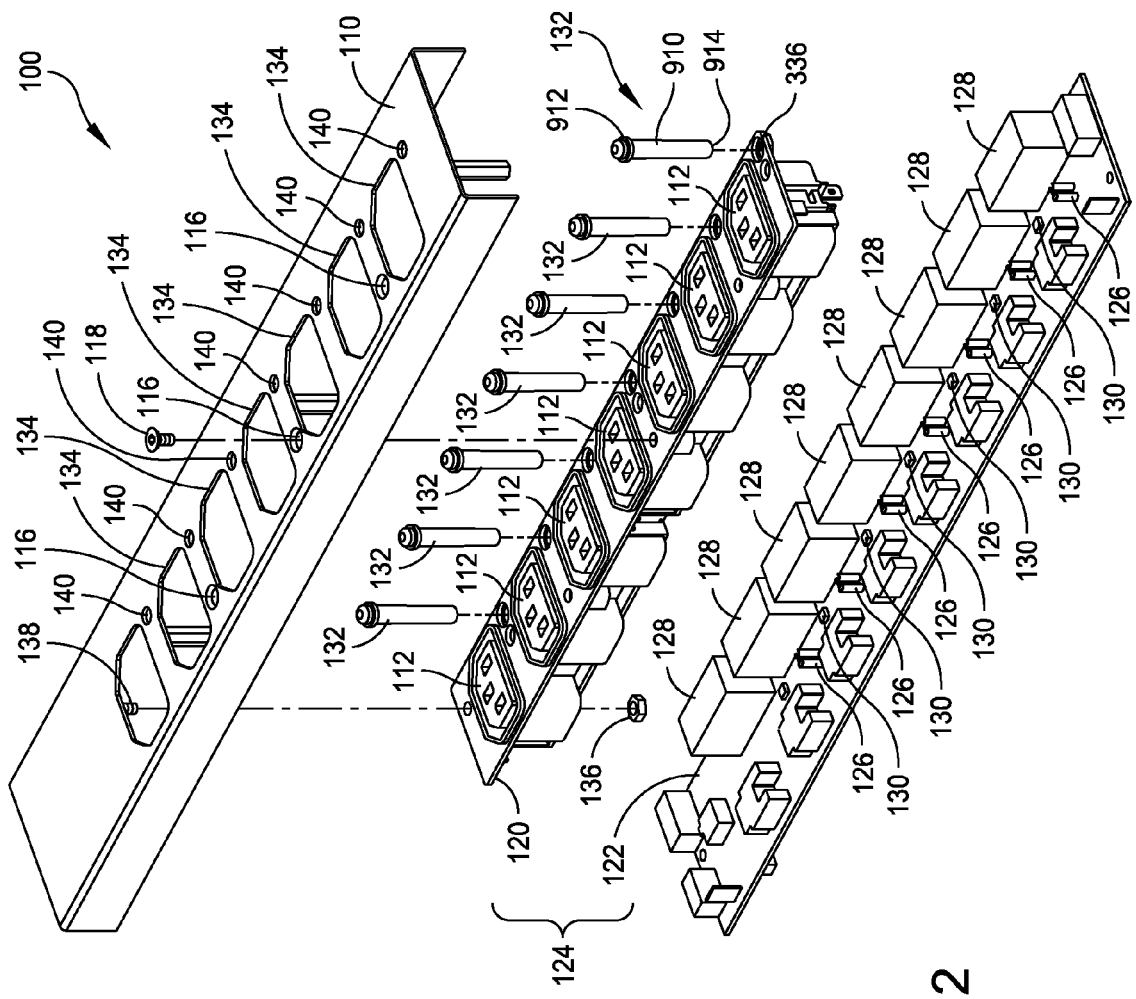
FIG. 2 is an exploded perspective view of an exemplary PDU in accordance with one embodiment of the present disclosure.

An exemplary embodiment of a PDU 100 is shown in FIGS. 1 and 2. The PDU 100 comprises a cover 110, multiple electrical outlets each indicated at 112, and one or more outlet status indicators 114. As shown, there is an outlet status indicator 114 for each electrical outlet 112. A sub-assembly 124 (described below) is secured to the cover 110 with a fastener 118 through an opening 116. The PDU 100 is adapted for mounting within an equipment enclosure but may also be adapted for stand-alone use. The PDU 100 may be accordingly configured with a fastener or other device (not shown) suitable for securing the PDU 100 to the equipment enclosure. The outlets 112 are configured to conform to a standard receptacle type, for example IEC C13, but may conform to any receptacle type according to a particular application of the PDU 100. Each outlet 112 may be operated individually, or two or more of these outlets may be electrically ganged together for switching and control purposes. For example, a PDU having seven outlets may have three outlets ganged to an uninterruptible power supply (UPS) and the remaining four outlets ganged to a surge-protected power supply. Alternatively, the outlets may be ganged in other configurations according to the particular application of the PDU 100. In the one embodiment, the outlets 112 are contained within a unitary outlet body 120. The outlet body 120 is molded from a single piece of material, such as plastic, and the outlets are formed as part of the molding process. This construction allows the overall size of the outlet body 120 to be more compact than a construction in which each outlet 112 is separately formed and assembled. A unitary architecture also allows the core components of the PDU 100, including the outlets 112 within the outlet body 120, to be manufactured as a single unit, thereby reducing its size, complexity and cost, as well as promoting ease of assembly. Furthermore, the outlet body 120 may have additional features including integrated electrical connections to reduce or eliminate wiring, integrated mounting points for attaching ancillary hardware and enclosures, and integral passageways for electrical and mechanical connections and the outlet status indicators 114, all of which will be discussed in detail as the description proceeds.

In one exemplary embodiment, the outlets 112 are aligned in a single row with respect to one another to facilitate a slim, low-profile design. It will be understood, however, that other arrangements of the outlets are possible to accommodate the requirements of a particular application, for example, two parallel rows of outlets. In one embodiment, each outlet is oriented with its electrical connections (e.g., prong connectors) perpendicular to the longitudinal (i.e., length-wise) axis of the PDU 100.

According to an aspect, the outlets 112 are electrically interconnected with a power source (not shown) through a substrate 122 to which the outlet body 120 is attached, forming a sub-assembly 124 including the outlets 112 and the substrate 122. In one embodiment, the substrate 122 is a printed circuit board (PCB) with electrical connectors each indicated at 126 for mechanically mounting the outlet body 120 to the substrate 122 and for conducting power from a power source to the outlets 112 by the substrate 122. The attachment may be accomplished by, for example, snap-fit connectors for a simple wireless and solderless connection. The substrate may also have mounted thereon various other electrical components, such as relays 128 for controlling the outlets, and light emitting diodes (LEDs) 130, for providing a visual indication of the status of each outlet, which will be discussed in detail as the description proceeds. The substrate 122 may also include current sensors (not designated) for each outlet 112. These additional components may be pre-arranged on the substrate 122 to accommodate a particular outlet body configuration to simplify sub-assembly of the outlet body 120 to the substrate 122.

According to another aspect, the PDU 100 may also include the outlet status indicators 114 referenced above. In one exemplary embodiment, adjacent to each outlet 112, a lighted outlet status indicator 114 informs a user whether the corresponding outlet 112 is energized. In one exemplary embodiment, the indicator light source is the LED 130 (already introduced) mounted on the substrate 122. To allow a user to easily observe the indicator 114, a light pipe 132 carries the light from the LED 130 to the cover 110 for easy viewing. The light pipe 132 may be constructed of transparent or translucent plastic or another material, such as optical fiber.

According to an aspect, the cover 110 of the PDU 100 (already introduced) includes openings or access apertures 134 aligned with the outlets 112 for accessing the outlets through the cover. In one embodiment, the sub-assembly 124 is adapted for back-mounting to the cover 110; however, it will be understood that this embodiment is exemplary and other mounting configurations may be utilized to enclose the sub-assembly 124. The cover 110 encloses and secures the sub-assembly 124 and the light pipes 132. The cover 110 also includes openings 140 to expose the status indicators 114, which may include an observable end of the light pipes 132. The cover 110 further includes openings 116 for receiving one or more mounting fasteners 118 which secure the outlet body 120 to the cover 110. The cover 110 may be fabricated from an electrically conductive material, such as metal, to assist in providing a grounding path for the outlets 112. The light pipes 132 are mechanically secured by the cover 110 to prevent them from becoming dislodged inadvertently, details of which will be provided as the description proceeds. The PDU 100 includes the combination of the cover 110 and the sub-assembly 124, which may be mounted within an equipment rack and connected to a power supply, which may also be provided within the equipment rack.

Figure 3:
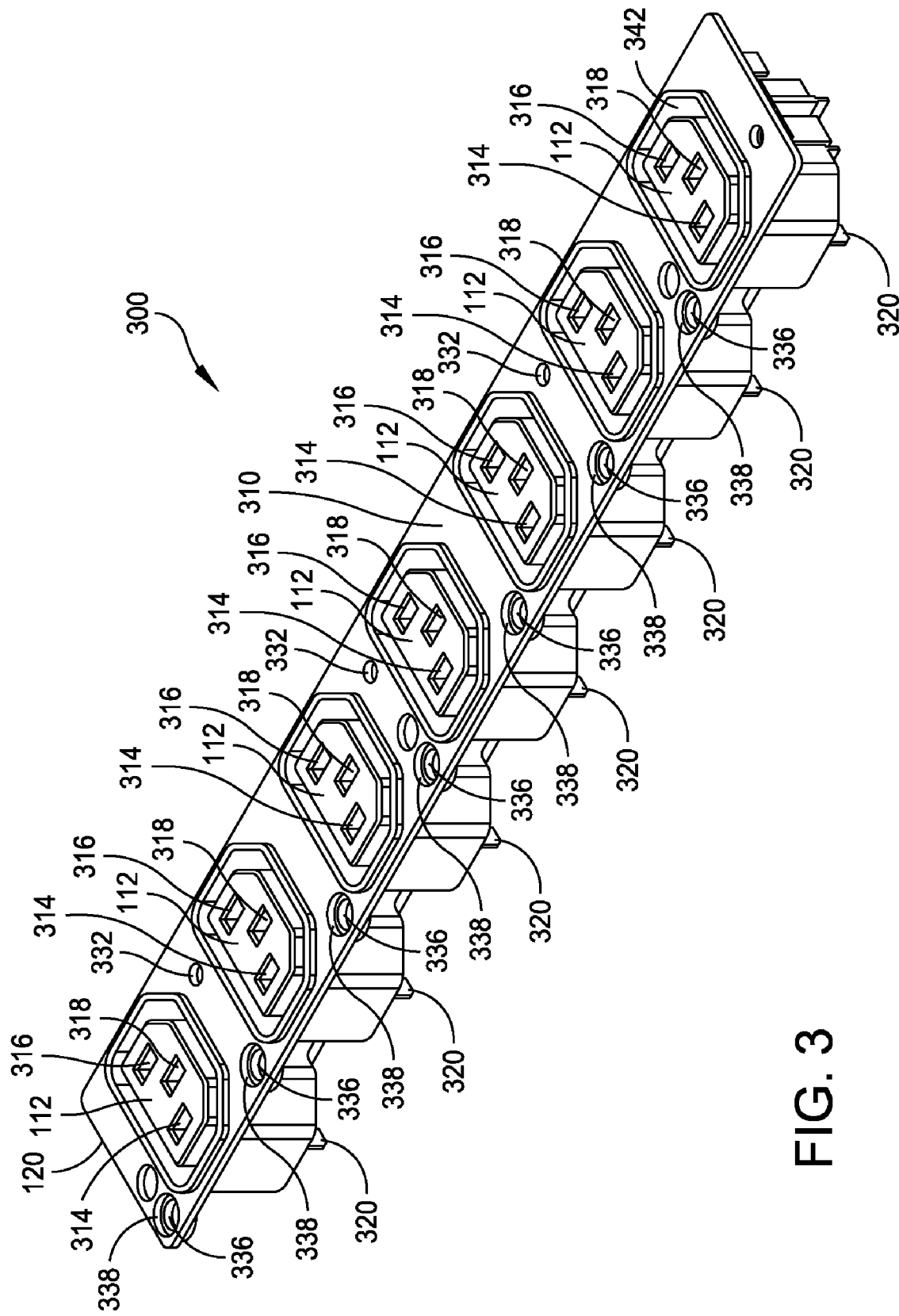
FIG. 3 is a top perspective view of an exemplary ganged outlet in accordance with one embodiment of the present disclosure.
Figure 4:
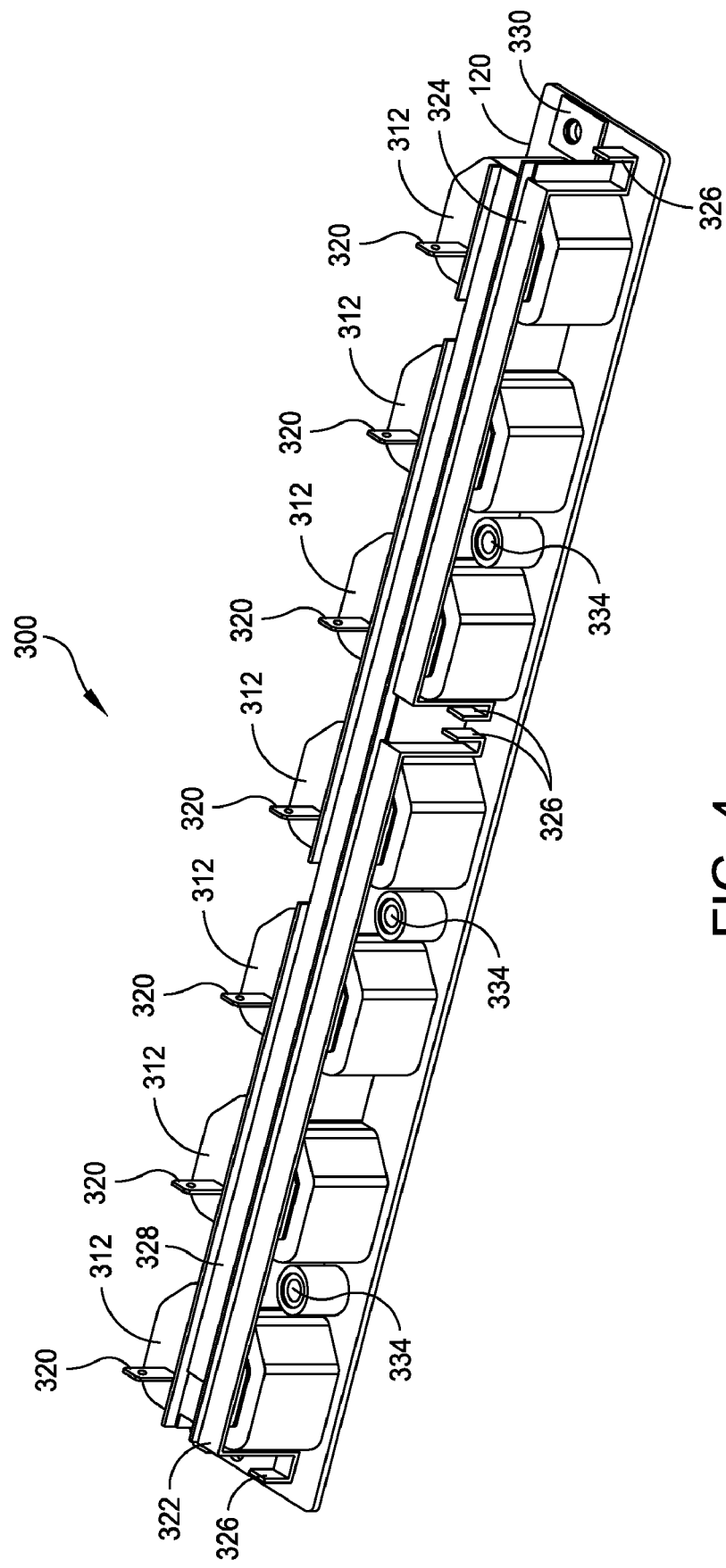
FIG. 4 is a bottom perspective view of an exemplary ganged outlet in accordance with one embodiment of the present disclosure.
Figure 5:
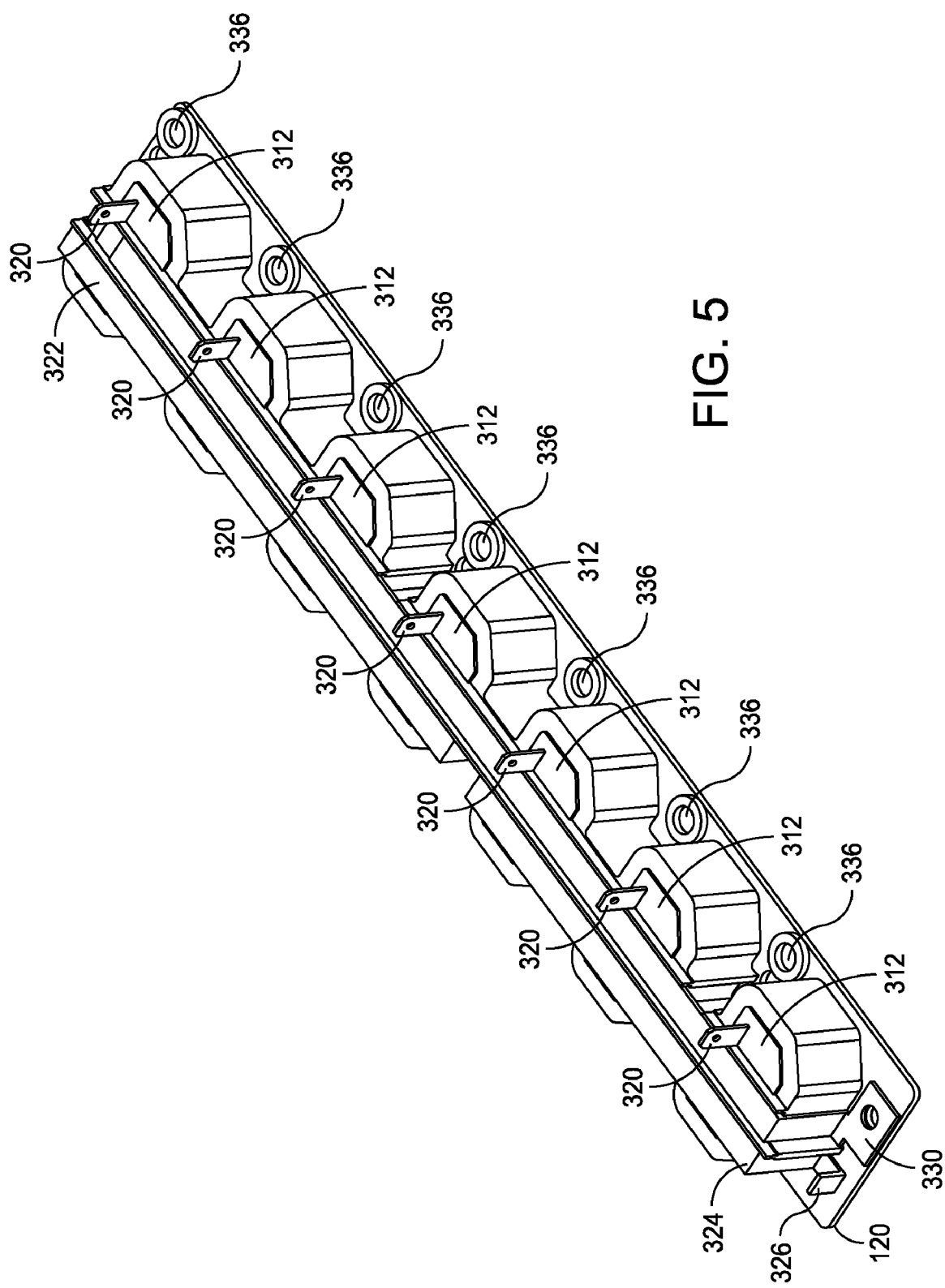
FIG. 5 is a bottom perspective view of an exemplary ganged outlet in accordance with one embodiment of the present disclosure.

Another aspect of the present disclosure relates to the provision of a ganged outlet 300 as shown in FIGS. 3-5. As used herein, the term "ganged outlet" is broadly defined as a plurality of electrical outlets 112, also referred to as outlet connectors or receptacles, electrically interconnected and arranged in a fixed orientation with respect to each other. In one embodiment, an outlet body 120 of the ganged outlet 300 is molded as a single unit or module, wherein additional components, such as electrical terminals or connections, are subsequently installed or installed as part of the molding process. However, it also will be understood that the outlets 112 may be molded or formed as separate parts that can subsequently be joined together to form the ganged outlet 300.

In one exemplary embodiment, as shown in FIGS. 3 and 4, the outlet body 120 includes outlets 112, each of type IEC C13, although it will be understood that alternative types and numbers of outlets can be used. It also will be understood that the outlets 112 are not limited to three-prong receptacles nor are they necessarily comprised of female connectors as shown in this embodiment. The outlet body 120 also has a front surface 310 and a back surface 312. Each outlet 112 opens out to the front surface 310, and includes at least two receptacle contact elements, a first contact element 314 for supplying a line (or hot) connection and a second 316 for supplying a neutral (or common) connection to any electrical equipment connected to the outlet 112. The outlet 112 may also optionally include a third contact element 318 to provide a safety ground connection. These contact elements 314, 316, and 318 are accessible through the front surface 312 of the outlet 112 by inserting a conforming plug.

Referring now to FIG. 4, in an aspect, each outlet 112 includes a line terminal 320 extending from the back surface 312 of the outlet. The line terminal 320 is electrically connected to the first (line) contact element 314 in the corresponding outlet 112. In one embodiment, the line terminal 320 is formed in a manner that allows it to be snap-fit to a corresponding receiving connector 126 on the substrate 122, as shown in FIG. 2, for example, as a tab. The line terminal 320 enables the outlet body 120 to be connected to the substrate 122 both mechanically and electrically to form a subassembly 124. In one embodiment, one of a plurality of relays 128 (FIG. 2) on the substrate 122 switches power to the respective line contact element 314 of each outlet 112 via the corresponding line terminal 320.

According to another aspect, attached to the back surface 312 is at least one neutral bus bar 322. In one embodiment, one neutral bus bar 322 extends over a portion of the length of the outlet body 120, and an additional neutral bus bar 324 may extend over another portion of the outlet body 120. This may be referred to as a split neutral bus bar configuration. By splitting the neutral bus bar into multiple segments (bar bars 322, 324) groups of outlets 112 can be electrically ganged together. For example, in a ganged outlet having seven outlets in which four of the outlets are ganged to a UPS, the first neutral bus bar 322 interconnects those four outlets and the second neutral bus bar 324 interconnects the remaining three outlets to a separate power source. Each neutral bus bar 322, 324 is electrically connected to the second (neutral) contact element 316 of each outlet 112 under which the neutral bus bar passes along the back surface 312. In another embodiment, there may be one neutral bus bar (e.g., neutral bus bar 322) extending the entire length of the outlet body 120, in which the neutral bus bar is electrically connected to the second contact elements 316 of all outlets 112, thus ganging all outlets 112 to a common power supply.

In one embodiment, the neutral bus bars 322, 324 are flat and mounted flush against the base surface 312 so as to minimize the overall height of the ganged outlet 300. It will be understood that the bus bars need not be exposed and may be fully or partially contained within the outlet body 120 or covered by another part of the outlet body 120 or PDU 100.

Each of the neutral bars 322, 324 may also have, at a first end and at a second end, one or more neutral tabs 326 for connecting the neutral bus bar 322, 324 to a power source. This connection may be made, for example, using stranded wire having snap-fit terminals for a quick and solderless connection between the neutral tab 326 and the wire. Where more than one neutral bar 322, 324 is present, adjacent neutral tabs 326 may optionally be connected together using a jumper to gang the adjoining groups of outlets 112 together.

According to another aspect, a ground bus bar 328 is attached to the back surface 312 in a manner similar to the neutral bus bar 322, 324. In one embodiment, the ground bus bar 328 runs along the back surface 312 for the length of the outlet body 120 parallel to and in electrical isolation from the neutral bus bars 322, 324. The ground bus bar 328 is electrically connected to the third (ground) contact element 318 of each outlet 112. At one end of the ground bus bar 328 is a grounding connection portion 330 for electrically grounding the ground bus bar 328 and, accordingly, each outlet 112, to the cover 110 using an electrically conductive fastener, such as a metallic nut 136 attached to a post 138 inside the cover 110, as shown in FIG. 2. This configuration eliminates the necessity of using wire to make the ground connections from the outlets 112 and provides a simple, secure and reliable connection. It will be understood this configuration is exemplary and other configurations may be utilized. For example, a ground bus bar having tabs at each end similar to the neutral bus bar may be provided.

Figure 6A:
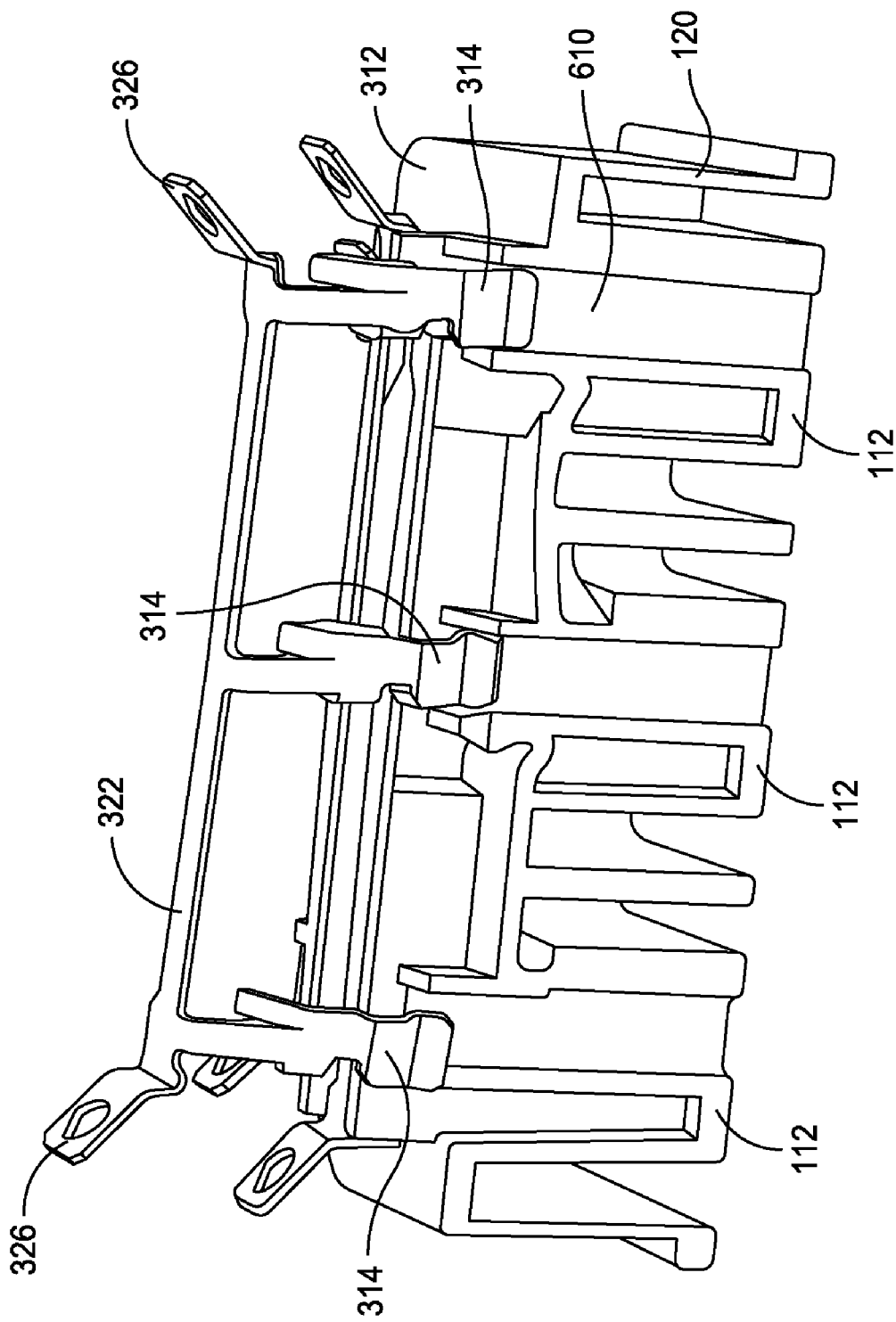
FIGS. 6A and 6B are perspective side cut-away views of two exemplary ganged outlets in accordance with one embodiment of the present disclosure.
Figure 6B:
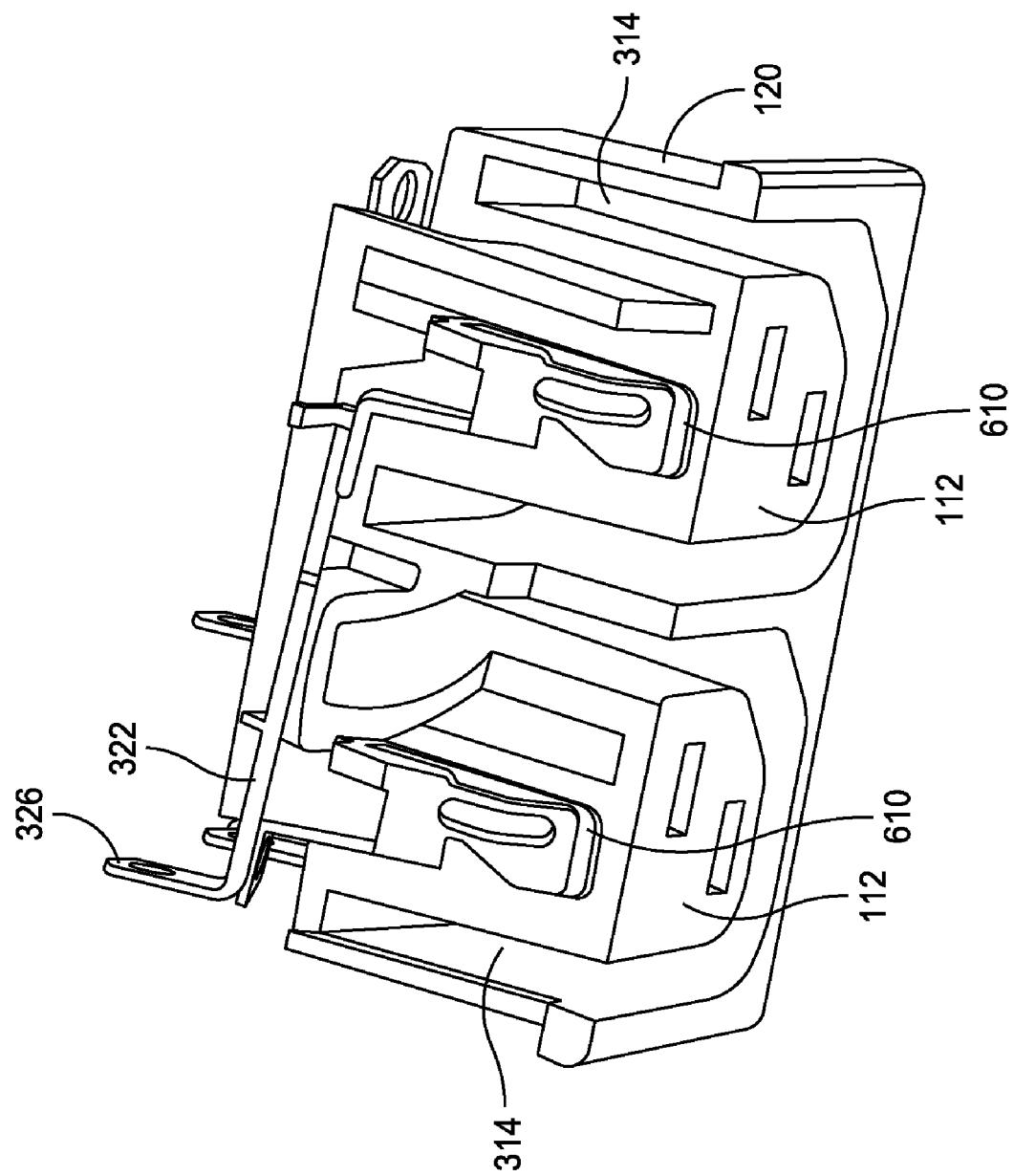

FIGS. 6A-6B show a cross-section of one embodiment of an outlet body 120 and a bus bar 322 having multiple electrical contacts 314. The bus bar 322 may be stamped from a single piece of material, as shown in FIG. 6A, or may be formed by joining separate pieces of material together, as shown in FIG. 6B, for example by using solder. The outlet body 120 has multiple outlets 112 and a back surface 312 through which openings 610 are formed into each outlet for inserting the electrical contacts 314 into the outlet body 120 from the rear. In this manner, the electrical contacts 314 may be press-fit into the openings 610 for ease of installation. After installation, the electrical contacts 314 are aligned within the openings 610 such that when an electrical plug is inserted into the outlet 112, the corresponding prongs of the plug will be in contact with the electrical contacts 314. The outlet body 120 may be constructed to retain the bus bar 322 against the back surface 312.

Referring again to FIGS. 3-5, in an aspect, the outlet body 120 may include a plurality of mounting bores 332 and threaded inserts 334 therein for receiving fasteners (such as fasteners 118) to mount the outlet body 120 to the cover 110. The outlet body 120 is placed against the back or underside of the cover 110 and the two parts are secured together with a screw or a similar fastener inserted through the mounting bores 332 and into the threaded inserts 334. It is understood that other types of fasteners and methods of fastening may be utilized to secure the outlet body 120 to the cover 110.

Figure 7:
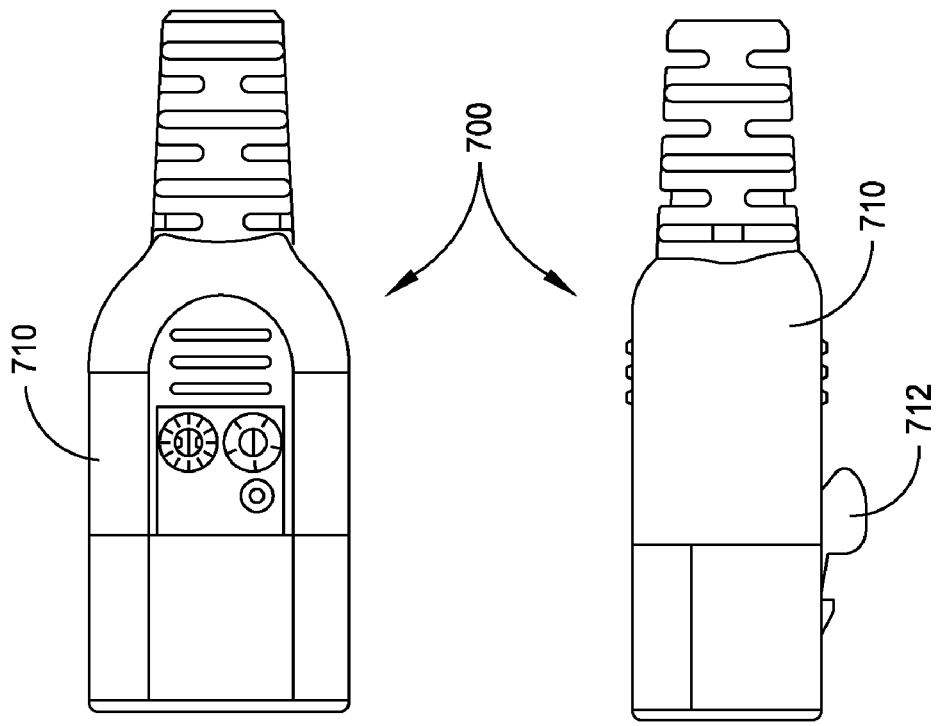
FIG. 7 includes side, top and front views of an exemplary electrical inlet connector with locking member.
Figure 7:
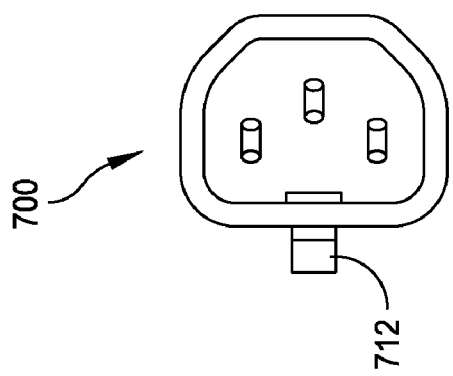

Another aspect of the present disclosure relates to a ganged outlet adapted for receiving locking inlet connectors. FIG. 7 shows an exemplary electrical inlet connector 700 having a plug body 710 and locking member 712 conforming to the IEC C14 standard. It will be understood that other types of connectors may be utilized in a particular application. The locking member 712 may be resiliently depressible to allow the locking member 712 to engage and disengage a complementary structure within the outlet 112, which is described as follows.

Figure 8A:
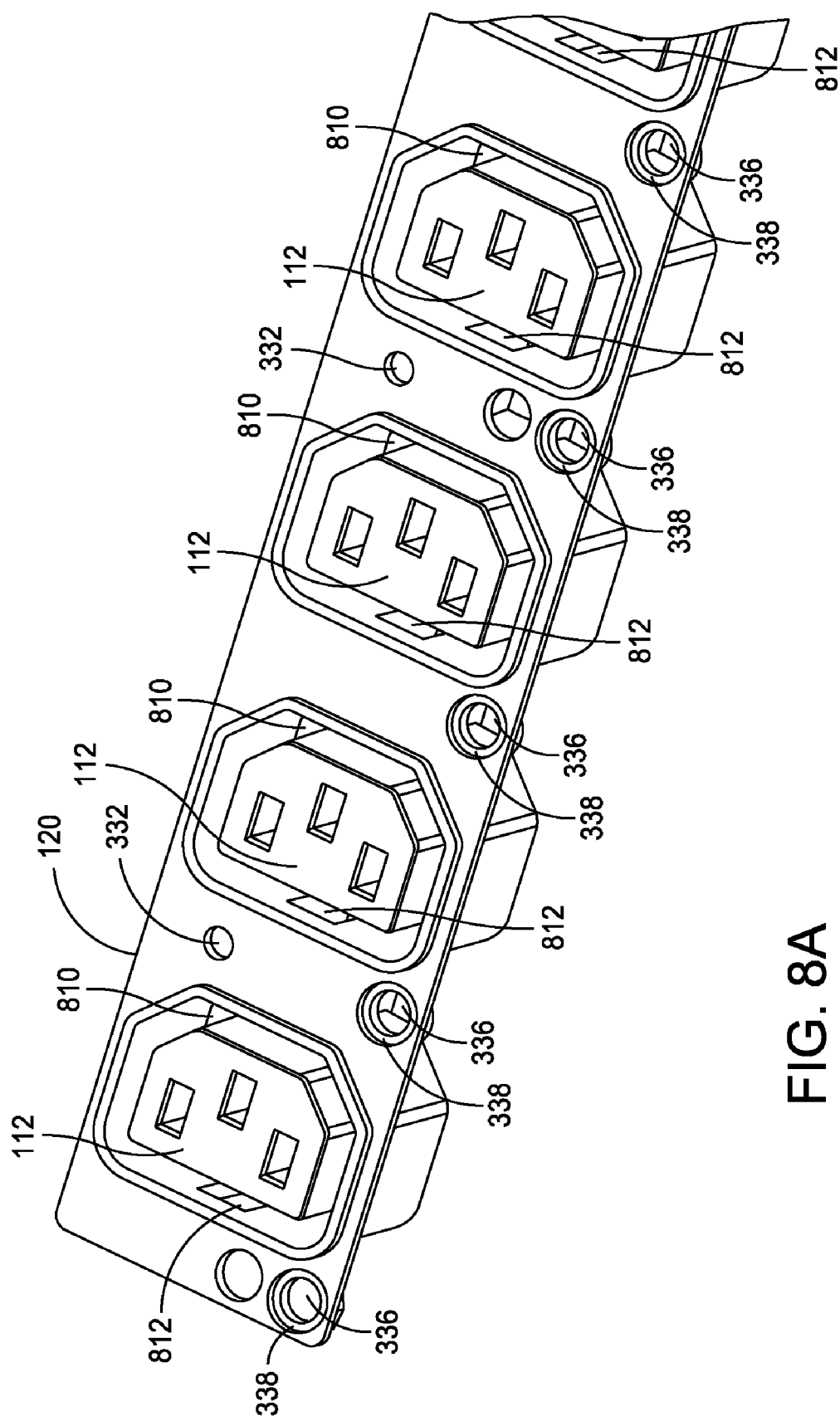
FIGS. 8A and 8B are detail perspective views of an exemplary locking outlet connector in accordance with one embodiment of the present disclosure.
Figure 8B:
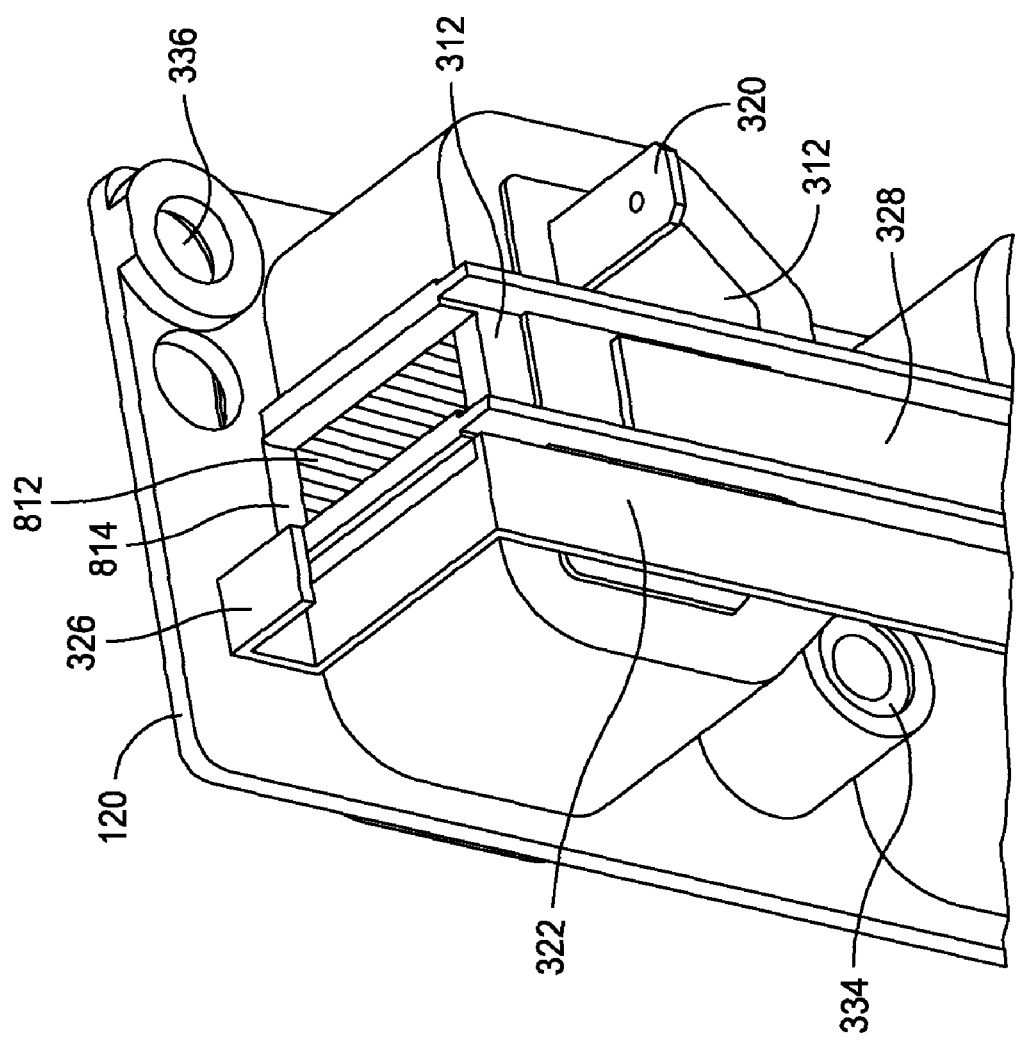
Figure 8C:
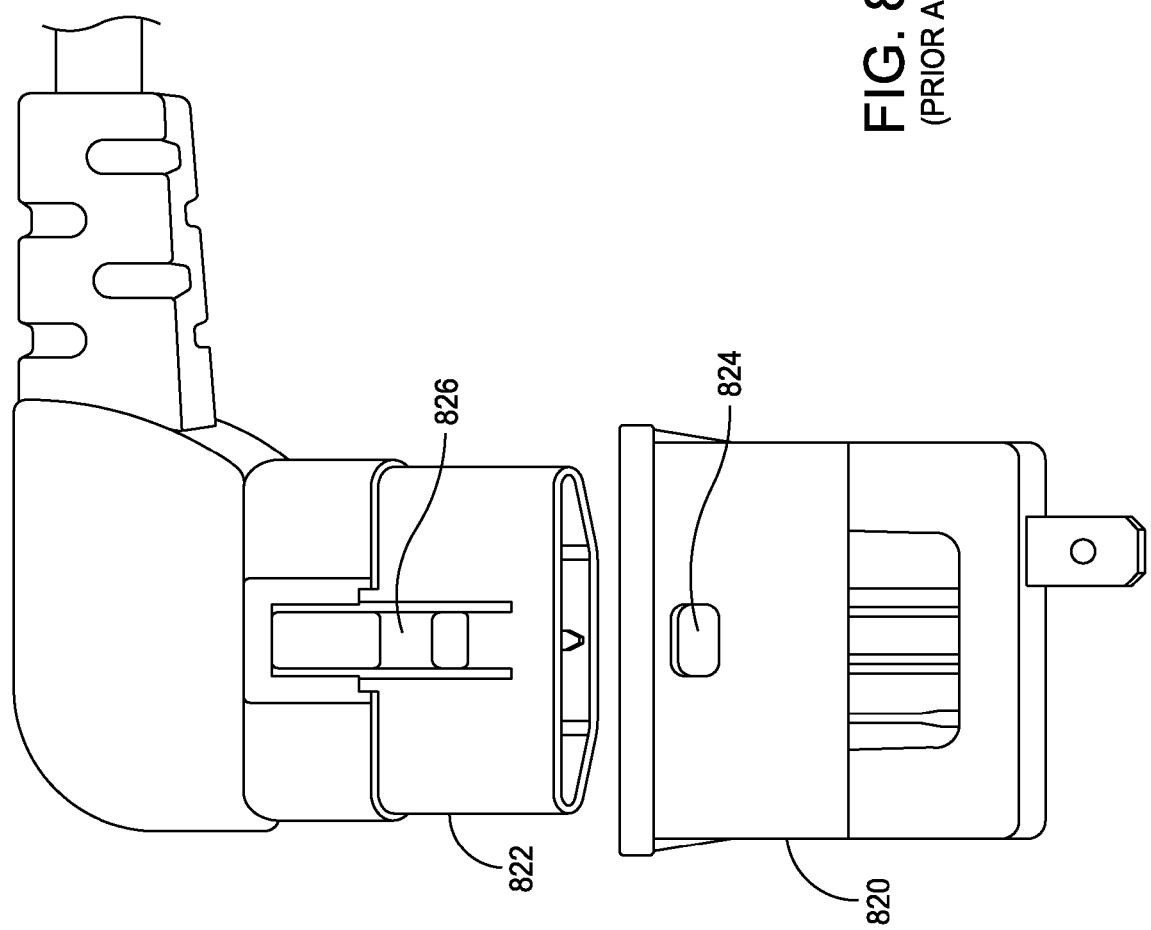
FIG. 8C is a side view of a prior art receptacle and electrical inlet connector.

Now referring to FIGS. 8A-8B, shown is an exemplary outlet body 120 having a plurality of outlets 112 for receiving an electrical inlet connector with a locking member, for example IEC C14. Each outlet 112 has an aperture 810 extending around the periphery of the outlet 112. Each outlet 112 includes an opening 812 contiguous with the aperture 810, and a shoulder 814. The opening 812 extends from the shoulder 814 through the back surface 312. Prior techniques employed a sliding core to form the opening 812. FIG. 8C shows a prior art receptacle 820 having an opening 824, and an electrical inlet connector 822 having a locking member 826. The opening 824 is a substantially rectangular opening adapted to receive the latching member 826 when the electrical inlet connector 822 is inserted into the receptacle 820. A sliding core is necessary to form the opening 824 when molding the receptacle 820, for the reasons discussed above. Referring back to FIGS. 8A-8B, the opening 812 may be formed without the use of a sliding core because the opening extends through the back surface 312, and therefore does not present the geometric difficulties of molding the outlet body 120 having an opening as described by the prior art. Thus, the problems associated with ejecting the part from the mold are avoided. The shoulder 812 acts as a retaining surface for engagement with the locking member 712 attached to the plug body 710 when securing the connector 700 to the outlet 112 of the PDU 100. It will be understood that the outlets 112 may be constructed according to alternative opening configurations to accommodate various types of electrical inlet connectors having locking features.

Figure 9:
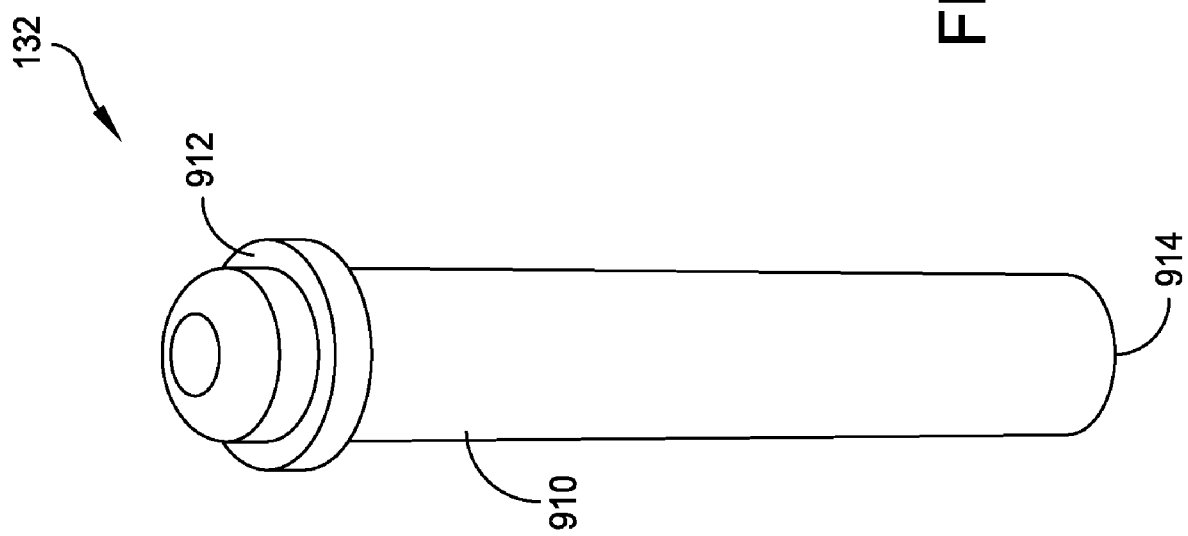
FIG. 9 is a perspective view of an exemplary light pipe in accordance with one embodiment of the present disclosure.

An aspect of the present disclosure relates to a ganged outlet adapted to hold at least one light pipe. Referring first to FIG. 3, associated with each outlet 112 and formed as a part of the outlet body 120 are a plurality of light pipe axial bores 336 extending through the front surface 310. As shown, each axial bore 336 has a concentric counterbore 338 opening to the front surface 310. These axial bores 336 and counterbores 338 are respectively dimensioned to hold a light pipe 132, as will now be described with reference to FIG. 9. As shown, an exemplary light pipe 132 has a cylindrical body 910 and a flange or collar 912 about the radius of the cylindrical body 910 at the upper end of the body. The body 910 is dimensioned to fit into the light pipe axial bore 336, with the flange 912 being dimensioned to be seated within the counterbore 338. The light pipe 132 has a distal end 914, which is positioned against the substrate 122 (FIG. 2) and the LED 130 when assembling the light pipe 132, the outlet body 120, and the substrate 122 together.

Referring back to FIGS. 2-3, in one embodiment, the light pipe 132 is inserted into the light pipe axial bore 336 and counterbore 338 from the front side 310 of the outlet body 120. In this position, the flange 912 is seated within the counterbore 338. The cover 110, having corresponding openings 140, is placed over the outlet body 120. The cover 110 secures the light pipe 132 between the outlet body 120 and the cover 110 since the flange 912 is larger in diameter than the diameter of the corresponding opening 140 in the cover 110 and the light pipe axial bore 336. It will be understood that alternative configurations of the light pipe 132, outlet body 120 and cover 110 may be used to secure the light pipe 132 within the PDU 100. In one embodiment, when the light pipe 132 is secured, the distal end 914 may be proximately located to the LED 130, such that light emitted from the LED 130 is communicated through the light pipe 132 so that it is visible from outside the cover 110.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

For example, the ganged outlets may be constructed or arranged for use in a conventional power strip, in a wall-mounted electrical box, or in other types of enclosures. The PDU may contain any number of outlets. The outlets may also be arranged in configurations other than in a single row. For example, there may be two or more parallel rows of outlets. The PDU may be configured to provide different voltages, such as 110 VAC, 220 VAC, etc. The PDU may also include other features, such as intelligent switching capabilities, remote control, overload protection, surge and/or lightning protection, and an uninterruptible power supply.

In another example, the PDU may include only one lighted status indicator, or one indicator for each of several groups of outlets, or no indicators. Additionally, the light pipes may be constructed in various ways to accommodate different configurations of the outlets and/or substrate. For example, the light pipes may be constructed from fiber optics, which are flexible and therefore may allow the light source to be mounted in a myriad of locations within the PDU. Additionally, the ganged outlets may be adapted to provide other types of connections, for example registered jack (RJ) connections such as those used by telecommunications or Ethernet interfaces.

What is claimed is:

1. An electrical ganged-outlet apparatus comprising:
a plurality of electrical outlets molded together as a unitary outlet body having a front surface and a back surface, each of the plurality of electrical outlets having:
an aperture extending through the front surface, the aperture being constructed and arranged to receive an electrical inlet connector therein;
a peripheral wall and a sidewall opposing the peripheral wall, the peripheral wall and the sidewall defining the aperture;
a shoulder adjacent to the front surface of the unitary outlet body and the sidewall of the electrical outlet, the shoulder being constructed and arranged to engage a latching member attached to the electrical inlet connector when the electrical inlet connector is inserted into the aperture; and
an opening molded in the sidewall adjacent to the shoulder and in communication with the aperture, the opening extending from the shoulder through the back surface, the opening being constructed and arranged to receive the latching member to retain the electrical inlet connector within the aperture.

2. The electrical ganged-outlet apparatus of claim 1, wherein the unitary outlet body has at least one line terminal extending therefrom, the at least one line terminal being electrically connected to at least one of the plurality of electrical outlets.

3. The electrical ganged-outlet apparatus of claim 2, further comprising a substrate releasably coupled to the at least one line terminal.

4. The electrical ganged-outlet apparatus of claim 3, wherein the substrate comprises at least one light emitting diode mounted to the substrate.

5. The electrical ganged-outlet apparatus of claim 4, wherein the unitary outlet body has at least one light pipe axial bore extending through the front surface substantially in axial relation to the at least one light emitting diode, wherein each at least one light pipe axial bore has a counterbore concentric with the at least one light pipe axial bore, wherein the counterbore opens to the front surface, and wherein the counterbore has a diameter greater than the at least one light pipe axial bore.

6. The electrical ganged-outlet apparatus of claim 5, further comprising at least one light pipe disposed in the at least one light pipe axial bore, each at least one light pipe comprising a cylindrical body and a flange radially extending therefrom such that the cylindrical body fits within the respective light pipe axial bore and the flange is seated within the respective counterbore.

7. The electrical ganged-outlet apparatus of claim 6, further comprising a cover attached to the unitary outlet body, the cover having at least one opening configured to align with the cylindrical body of the at least one light pipe, wherein the flange of the at least one light pipe is secured within the counterbore by the cover.

8. The electrical ganged-outlet apparatus of claim 2, wherein each of the plurality of electrical outlets has at least first and second receptacle contact elements, and wherein the line terminal is electrically connected to the first receptacle contact element and extends from the back surface.

9. The electrical ganged-outlet apparatus of claim 8, further comprising at least one neutral bus bar disposed against the back surface and electrically connected to the second receptacle contact element of at least one of the plurality of electrical outlets.

10. The electrical ganged-outlet apparatus of claim 9, wherein the at least one neutral bus bar includes a first end and a second end, the first end and the second end each being constructed and arranged to be connected to at least one power supply.

11. The electrical ganged-outlet apparatus of claim 10, wherein each of the plurality of electrical outlets has a third receptacle contact element, and wherein the electrical ganged-outlet apparatus has a ground bus bar disposed against the back surface of the outlet body and electrically coupled to the third receptacle contact element of each of the plurality of electrical outlets.

12. The electrical ganged-outlet apparatus of claim 11, wherein the ground bus bar is adapted to be electrically coupled to the cover.

13. The electrical ganged-outlet apparatus of claim 1, further comprising a cover, the unitary outlet body being releasably mounted to the cover, the cover having a plurality of access apertures for accessing each of the plurality of electrical outlets.

14. The electrical ganged-outlet apparatus of claim 13, wherein the unitary outlet body further comprises a plurality of axial bores each having an internal thread adapted to receive an external thread of an externally threaded fastener for mounting the unitary outlet body to the cover.

* * * * *